United States Patent [19]

Kondoh

[11] Patent Number: 5,381,088
[45] Date of Patent: Jan. 10, 1995

[54] CHANGE-OVER TYPE OF TESTING EQUIPMENT FOR NON-UTILITY POWER GENERATORS OR THE LIKE

[75] Inventor: Toyoshi Kondoh, Tokyo, Japan

[73] Assignee: Tatsumi Corporation, Tokyo, Japan

[21] Appl. No.: 135,161

[22] Filed: Oct. 12, 1993

[51] Int. Cl.$^6$ .................. G01R 31/34; G05F 3/00
[52] U.S. Cl. ................... 324/158.1; 338/56; 338/82
[58] Field of Search ........... 324/158 R, 158 MG; 338/56, 80, 82, 86; 322/99; 323/296, 297, 298

[56] References Cited

U.S. PATENT DOCUMENTS

| | | | |
|---|---|---|---|
| 4,510,483 | 4/1985 | Bensadoun | 338/80 |
| 4,853,621 | 8/1989 | Matsumoto | 324/158 R |
| 5,107,209 | 4/1992 | Kondo | 324/158 MG |
| 5,210,445 | 5/1993 | Kondoh | 324/158 R |
| 5,250,924 | 10/1993 | Kondoh | 338/56 |

*Primary Examiner*—Ernest F. Karlsen
*Attorney, Agent, or Firm*—Wenderoth, Lind & Ponack

[57] ABSTRACT

A change-over type of testing equipment for non-utility power generators, etc., includes a current-passing tank through which is charged with a resistance liquid, a main electrode disposed in the tank so as to receive power from the non-utility power generator to be tested, a movable insulator located between the main electrode and the tank to regulate the quantity of the current passing from the main electrode to the tank, a pipe system to cool or filter the resistance liquid within the tank for feeding the liquid back to the tank, thereby recycling the liquid, and a feed pipe connected to the pipe system on the upstream side of the tank to feed the liquid into the tank. The feed pipe serves as a holding member for holding the main electrode inserted into the tank from above and as a power supply member for supplying power from the non-utility power generator to be tested to the main electrode. The main electrode includes a small capacity type of water loading device selectively preset at a low or high voltage depending on the standard voltage of the non-utility power generator to be tested, a connecting terminal provided on the water loading device, and a plurality of fixed loading elements having connecting terminals, which are connected in parallel with each other together with the water loading device. The fixed loading elements includes a circuit set up by combining and connecting a plurality of resistors with each other and having a loading element body to which the output voltage of the power generator is applied, and a change-over unit for selecting the resistors in the circuit so that the withstand voltage of the circuit corresponds to the output voltage of the power generator 1.

1 Claim, 16 Drawing Sheets

CHANGE-OVER TYPE OF TESTING EQUIPMENT FOR NON-UTILITY POWER GENERATORS OR THE LIKE

BACKGROUND OF THE INVENTION

1. Field of the Invention

The present invention relates to testing equipment for non-utility power generators, etc., set up in high-rise buildings or other facilities in order to deal with such emergent situations as power breakdown, thereby determining whether or not they are in good condition.

Generally, power generators are broken down into high-voltage large-capacity and low-voltage small-capacity types. In the present disclosure, power generators having a voltage of 6.6 KV or 3.3 KV and a capacity of 800 KW or higher are called the high-voltage large-capacity type, while those having a voltage of 6.6 KV or 3.3 KV and a capacity of 500 KW or less are referred to as the high-voltage small-capacity type.

Similarly, power generators having a voltage of 415 v or 200 V and a capacity of 800 KW or more are called the low-voltage large-capacity type, while those having a voltage of 415 V or 200 v and a capacity of 500 KW or less are referred to as the low-voltage small-capacity type.

2. Prior Art

Referring now to FIG. 16, there is a typical power supply testing system used so far for non-utility power generators. As illustrated, a rectangular tank 71, through which a current passes, is charged with resistance water 72 of about 20° C., While three pairs of vertically movable electrode plates 73 and 73 extending in three directions are immersed in the water 72, power is then supplied form a non-utility power generator (not shown) between the electrode plates 73 and 73 for the required time to test and confirm its performance such as its power generating ability or its serviceability.

Referring typically to the testing procedure of this type of testing equipment, there is constantly a current of about 642.6 A, when power is supplied from a non-utility power generator working at an output of 1,000 KVA, a power factor of 0.8 and a voltage of 415 V between the electrode plates 73 and 73 in the tank 71.

This power generator may be determined to have given power generating capability and serviceability, if there is no fault in its performance when power supply is continued for a given time in a matter of 3 hours.

However, the resistance water 72 in the tank 71 increases in temperature due to power supply and reaches as high as 80° C., when it overflows a drainage port 75, as illustrated.

To what degree current are passed between the electrode plates 73 and 73 through the resistance water 72 is greatly affected by the temperature rise or fall of the resistance water 72 and the degree of contamination of the resistance water 72. This in turn leads to a variation in the preset testing conditions, say, an output of 1,000 KVA, a power factor of 0.8, a voltage of 415 V and a current of 642.6 A, under which the non-utility power generator works to supply power between the electrode plates 73 and 73 in the tank 71, thus resulting in a current exceeding 642.6 A flowing through the tank 71.

For that reason, there is often an overload on the generator and the associated engine.

Thus, the conventional testing equipment is designed to keep a current passing through it from exceeding the preset value of 642.6 A. For instance, this is achieved by moving the electrode plates 73 vertically to regulate the current-passing areas thereof in the resistance water 72 or supply an additional amount of fresh, low-temperature resistance water 72 through a water supply port 74, thereby limiting the temperature rise of the resistance water 72 in the tank 71 (because an increase in the water temperature gives rise of excess currents).

However, the conventional testing equipment mentioned above is of size so large that it is very inconvenient to carry to where the power generator testing is needed and too much time and labor are needed until it is set up.

No precise control of the electrode plates 73 is achieved as well, because much difficulty is involved in their vertical movement.

Another serious problem with this equipment is that it needs a continuous supply of fresh resistance water 72, which must immediately be discarded. Not only is the use of such a large quantity of water economically unfavorable, but the resistance water 72, once used, must be incontinently discarded as well, thus making working environmental worse.

In order to provide a solution to the above problems, we have already come up with a small, economical and safe testing system which can test a non-utility power generator regardless of where it is set up, prevent an unusual current increase during testing by simple operation and making good use of resistance water.

For this testing system—the first invention that underlies the present invention, we filed a number of patent applications including JP-A-62-204866, JP-A-1-202554, JP-A-2-82183, JP-A-2-89754, JP-A-2-89755, JP-A-2-249798, JP-A-2-86755, JP-A-3-76270 and JP-A-3-100180.

The prior testing system set forth in these publications will now be explained briefly with reference to FIG. 15.

The prior system, as illustrated, is built up of a tank 81 charged therein with a resistance liquid 86, a plurality of electrodes 82, each being fixed at one end on the upper portion of the tank 81, extending downwardly through the tank 81 and immersed in the resistance liquid 86 for receiving power form the non-utility power generator to be tested, a plurality of movable insulators 83, each being disposed through the electrode 82 variable, and a fan 85 for feeding air forcibly onto the surface of a radiator 84 which serves to cool the resistance liquid 86 in the tank 81 (and onto which water is jetted from a spray pipe).

This testing system enables load tests for non-utility power generators, etc., to be done with a simplified structure but with no need of using large amounts of water.

Later, we have invented another testing system incorporated therein with metallic resistance members.

This water-free or dry type of testing system—the second invention that we accomplished—is applicable to every generator from a high-voltage large-capacity type (with the voltage and capacity being at least 700 V and at least 800 KW, respectively), to a high-voltage small-capacity type (with the voltage and capacity being at least 700 V and at most 500 KW, respectively), to a low-voltage large-capacity type (with the voltage and capacity being at most 700 V and at least 800 KW, respectively) and to a low-voltage small-capacity type (with the voltage and capacity being up to 700 V and up to 500 KW, respectively). Note that these figures are given as tentative criteria. For these systems, see JP-A-4-21235 and JP-A-5-100180.

In some cases, non-utility power generators must be set up in intermountain remote districts—that are depopulated areas, where much difficulty is encountered in providing large-enough amounts of water.

In some cases, they must be tested even en snowy districts having a large snowfall, where considerable difficulty is again encountered in supplying a large quantity of water.

Here the reason we have the second invention will be explained briefly. Much difficulty has been involved in making a dry type of testing equipment for testing high-voltage large-capacitor generators of the order of 6.6 KV in voltage and 2,000 KW in capacity. This has been not only because loading devices serving as resistance elements—made up of a metal member are imperatively of large size and cost much, but also because it is difficult to provide any fine adjusting mechanism for setting load.

In addition, conventional dry type testing apparatus for testing low-voltage large-capacity (with a voltage of about 200 V and a capacity of about 2,000 KW), high-voltage large-capacity type (with a voltage of about 3.3 KV and a capacity of 2,000 KW), low-voltage small-capacity (with a voltage of about 415 V and a capacity of about 500 W) and high-voltage small capacity (with a voltage of 3.3 KV and a capacity of about 500 W) types of power generators must be separately fabricated, resulting in a considerable cost rise.

Thus, we have accomplished the second invention so as to provide a solution to the above problems.

However, we have found that the second invention again poses some problems.

One grave problem arises from a combination of a transformer and a low-voltage small-capacity type of capacity-variable loading element connected to the transformer so as to regulate the load (capacity and current) values in a stepwise manner—that is an important factor of the second invention. That combination, esp., the transformer, because of being very heavy, is very difficult to carry to intermountain remote districts—that are depopulated areas.

Another serious problem arises from the fact that control of the load values may be achieved only by use of a stepwise (usually four-stage) procedure. It is still preferable to make use of a water resistor capable of regulating load values by a stepless procedure, while relying up a movable insulator, so as to achieve fine control of the load values.

The present invention is concerned with an improvement in or relating to our prior inventions. More specifically, an object of the invention is to provide a change-over type of testing apparatus for non-utility power generators, etc., which can be reduced in terms of gross weight and production cost, enables every power generator to be easily, precisely and rapidly tested without cooperation with other test equipment, makes it possible to achieve fine control of capacity value, and enables the amount of resistance liquid used to be reduced to about ¼ of that is needed for a testing apparatus made up of a water loading device alone.

SUMMARY OF THE INVENTION

According to the invention, the above object is achieved by the provision of a change-over type of testing equipment for non-utility power generators, etc., which includes;

a current-passing tank 12 through which is charged with a resistance liquid 10, a main electrode 14 disposed in the tank 12 so as to receive power from the non-utility power generator to be tested, a movable insulator 16 located between the main electrode 14 and the tank 12 to regulate the quantity of the current passing from the main electrode 14 to the tank 12, a pipe system 18 to cool or filter the resistance liquid 10 within the tank 12 for feeding the liquid 10 back to the tank 12, thereby recycling the liquid 10, and a feed pipe 20 connected to the pipe system 18 on the upstream side of the tank 12 to feed the liquid 10 into the tank 12, said feed pipe 20 serving as a holding member for holding the main electrode 14 inserted into the tank 12 from above and as a power supply member for supplying power from the non-utility power generator to be tested to the main electrode 14, said main electrode 14 including a small capacity type of water loading device 22 selectively preset at a low or high voltage depending on the standard voltage of the non-utility power generator to be tested, a connecting terminal 15 provided on the water loading device 22, and a plurality of fixed loading elements 19-1, 19-2, 19-3, ..., 19-n having connecting terminals 17-1, 17-2, 17-3, ..., 17-n, which are connected in parallel with each other together with the water loading device 22, said fixed loading elements 19-1, 19-2, 19-3, ..., 19n including a circuit 41 set up by combining and connecting a plurality of resistors with each other and having a loading element body 23 to which the output voltage of the power generator 1 is applied, and a change-over unit 24 for selecting the resistors in the circuit 41 so that the withstand voltage of the circuit 41 corresponds to the output voltage of the power generator 1, whereby said testing equipment can be accommodated to testing a low or high voltage type of power generator by selectively presetting the main electrode at a low or high voltage and changing over the connection of the resistors in the circuit 41 by the change-over unit 24, or to testing a small or large capacity type of power generator by changing over the connection of the water loading device 36 and the fixed loading elements 19-1, 19-2, 19-3, ..., 19-n.

PREFERRED EMBODIMENTS OF THE INVENTION

Preferable embodiments of the invention will now be explained with reference to the drawings.

Figure 1:
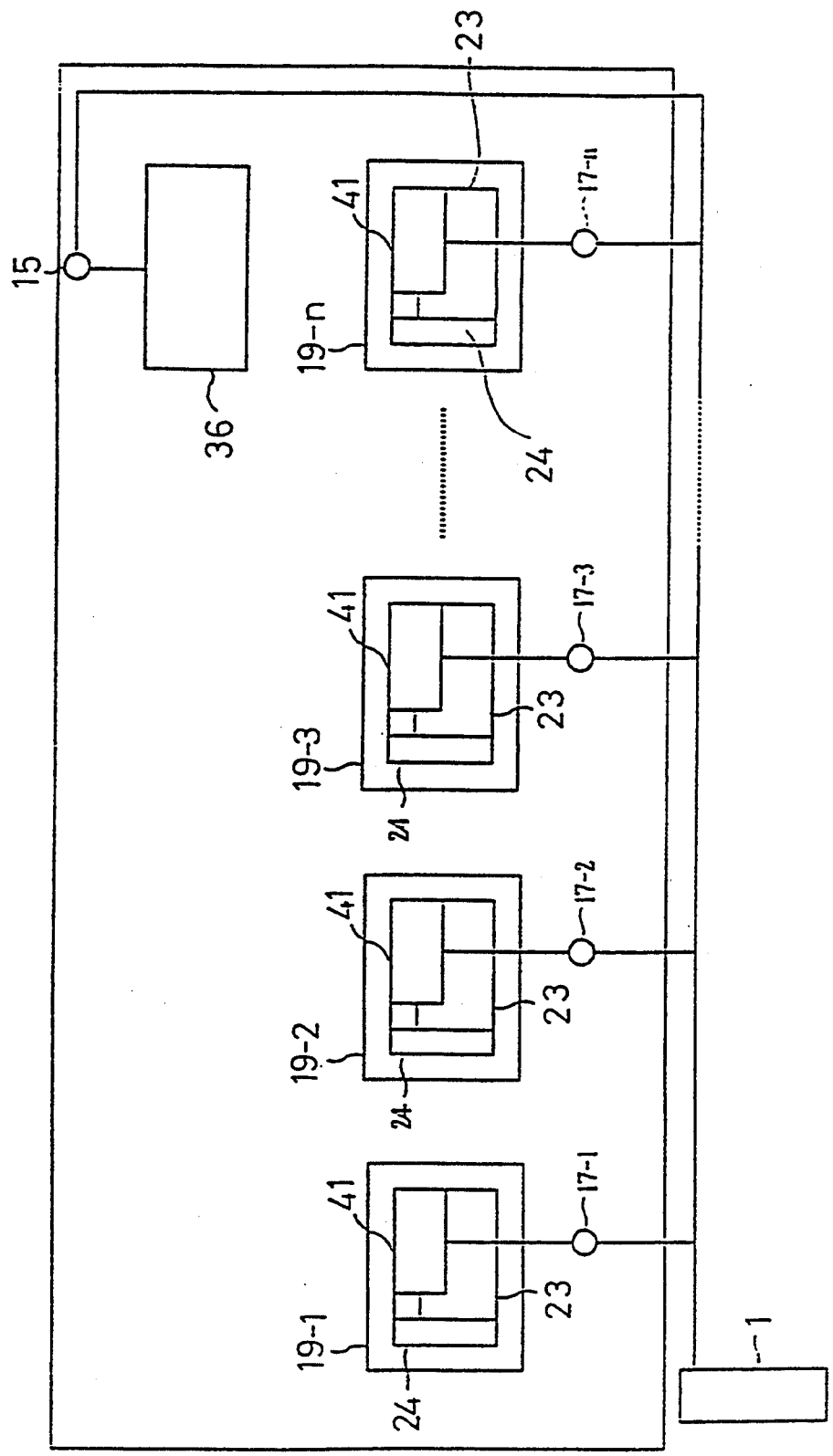
FIG. 1 represents the principles of the invention.
Figure 2:
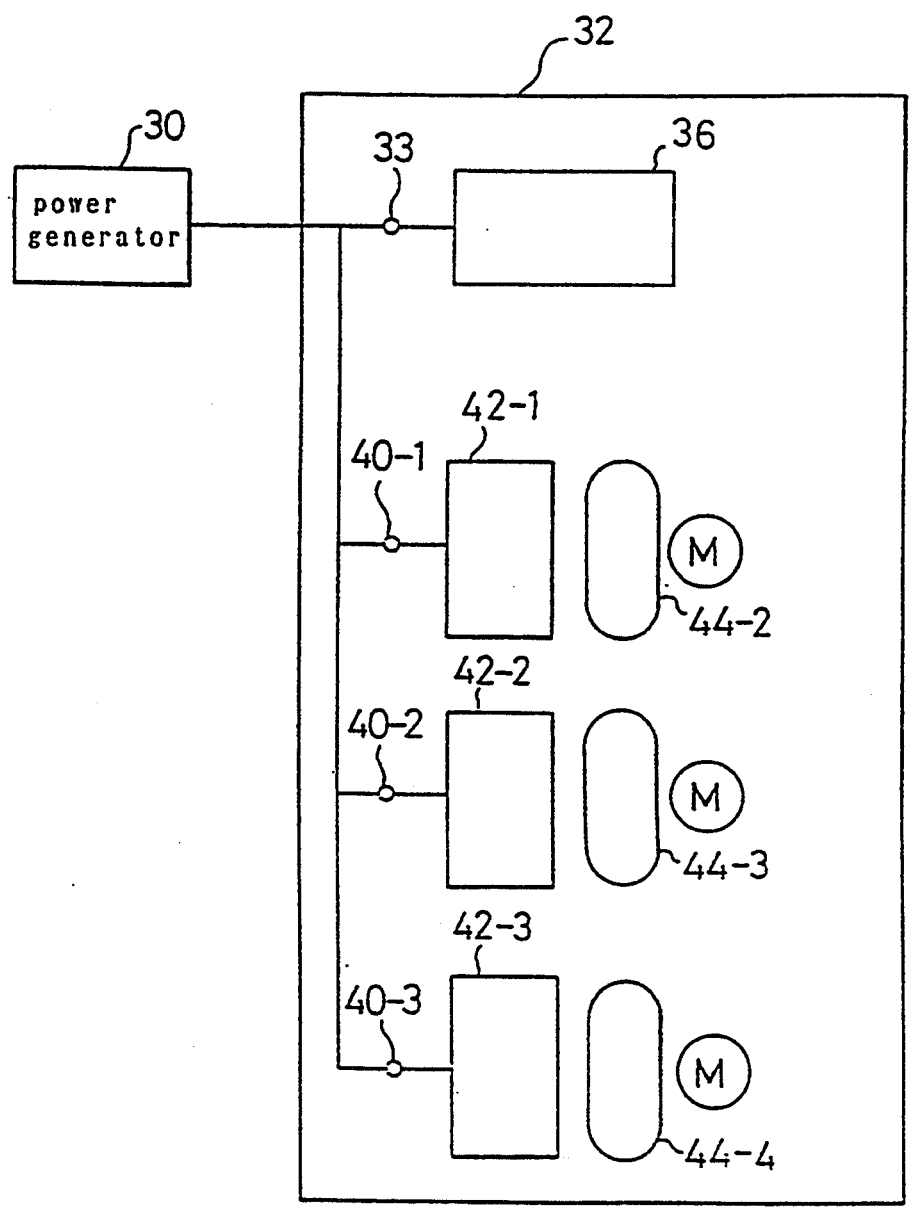
FIG. 2 represents the construction of one embodiment of the invention.

FIG. 2 is a schematic of one embodiment of the invention, with reference numeral standing for the non-utility power generator to be tested.

The power generator 30 is connected with a change-over type of testing apparatus 32 according to this embodiment.

Here the change-over type of testing apparatus 32 is built up of a small capacity type (e.g., variable 500 KW) of water loading device 36 which is connected to the generator 30 via a connecting terminal 33 and includes a main electrode assembly 14 of the interchangeable low or high voltage type, a plurality of high-voltage small-capacity (e.g., variable 6.6 KV and variable 500 KW) fixed loading elements 42-1, 42-2 and 42-3 connected to the power generator 30 via connecting terminals 40-1, 40-2 and 40-3, and fan elements 44-2, 44-3 and 44-4 located adjacent to the loading elements 42-1, 42-2 and 42-3.

The water loading device 36 and three fixed loading elements 42-1, 42-2 and 42-3 are connected in parallel with the power generator 30 via the connecting terminals 33, and 40-1, 40-2 and 40-3.

Figure 3:
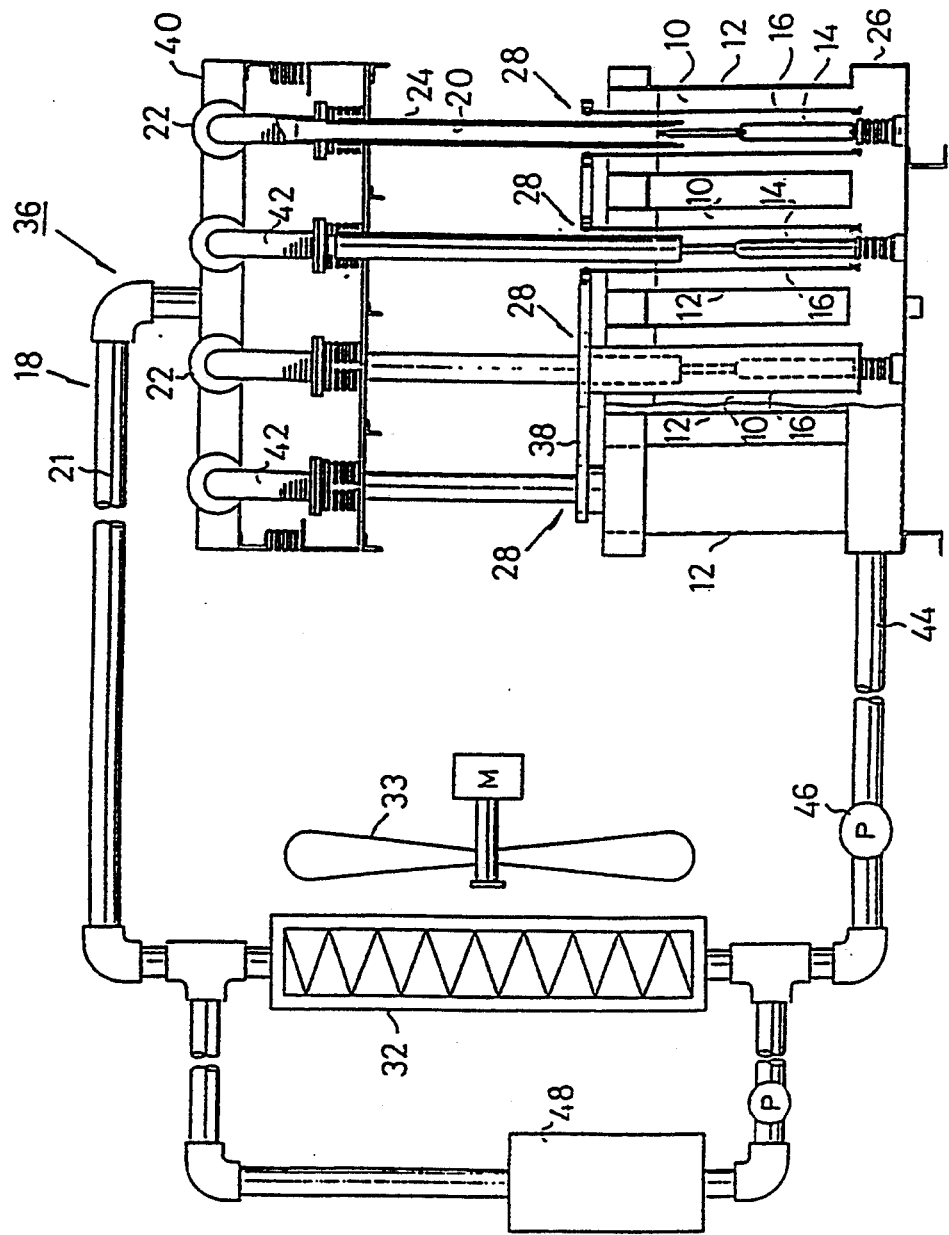
FIGS. 3 and 4 are schematics showing the construction of the water loading device.

Referring here to FIG. 3, the construction of the water loading device 36 is explained.

Reference numeral 26 stands for a common tank, above which four current-passing tank units 28 are located.

Of the four tank units 28, one is provided for spare purposes, because a generally available power generator is a three-phase alternate current type. Here note that even when the testing apparatus is not used, a resistance liquid is fed to this spare unit 28 so as to achieve fine control the resistance water 10 charged in all the units 28.

Each tank unit 28 is built up of a substantially cylindrical tank body 12 located above the common tank 26, a main electrode 14 located within the tank body 12 and depending from the upper portion of the tank body 12, and a movable insulator 16 interposed between the tank body 12 and the main electrode 14. The tank body 12 is charged with the resistance liquid 10.

A feed pipe 20 covered thereon with an insulating material 24 such as Teflon is introduced into each tank body 12. The main electrode 14 is detachably and interchangeably provided on the lowermost end of the feed pipe 20.

The feed pipe 20 serves not only as a power supply member for supplying power from the power generator 30 to be tested to the main electrode 14 but also as a holding member from which the main electrode 14 is depending.

The substantially cylindrical movable insulator 16 interposed between the tank 12 and the main electrode 14 is supported by an elevator 38 in vertically displaceable fashion.

The common tank 26 takes a role in collecting the water from within the tanks 12 located above it and feeding it to a radiator 32.

Another role taken by the common tank 26 is to take in an amount of air generated in the tanks 12 in operation and carry it into the spare tank 12 not in operation for ventilation.

This is because when currents are passed through the tanks 12 while much air exists therein, arcs are generated, affecting load balance and so making it impossible to conduct precise testing.

Above the tanks 12 there is provided a reservoir 40, which is connected to the respective feed pipes 20 a flexible hose 42 that is resistant to voltage and corrosion.

The reservoir 40 is provided with a main feed pipe 21 for supplying the resistance liquid 10, and a valve 22 for regulating the flow rate of the resistance liquid 10 to the feed pipes 20 is provided between the reservoir 40 and the flexible hose 42.

The common tank 26 located below the tanks 12 is provided with a drainage pipe 44 for draining the resistance liquid 10, which is in turn provided with a pump 46.

The drainage pipe 44 is connected to the radiator 32 which is connected on the outlet side with a main feed pipe 21.

Also, the drainage and feed pipes 44 and 21 are connected to a filter unit 48. In some cases, the resistance liquid 10 may be filtered without passing through the radiator 32.

Figure 4:
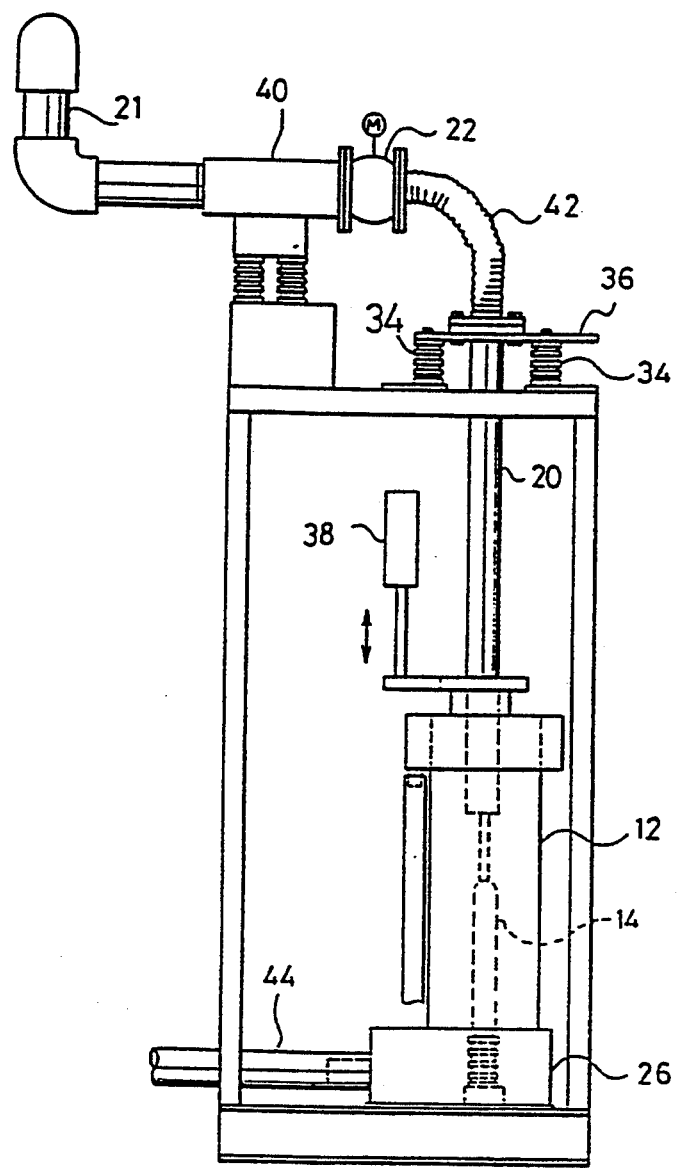

As can be seen from FIG. 4, the feed pipe 20 is provided at its upper end with a connecting terminal bar 36 through an insulator 34, and the cable of the non-utility power generator to be tested is connected to the connecting terminal bar 36 and the terminal (not shown) of the tank 12.

Figure 5:
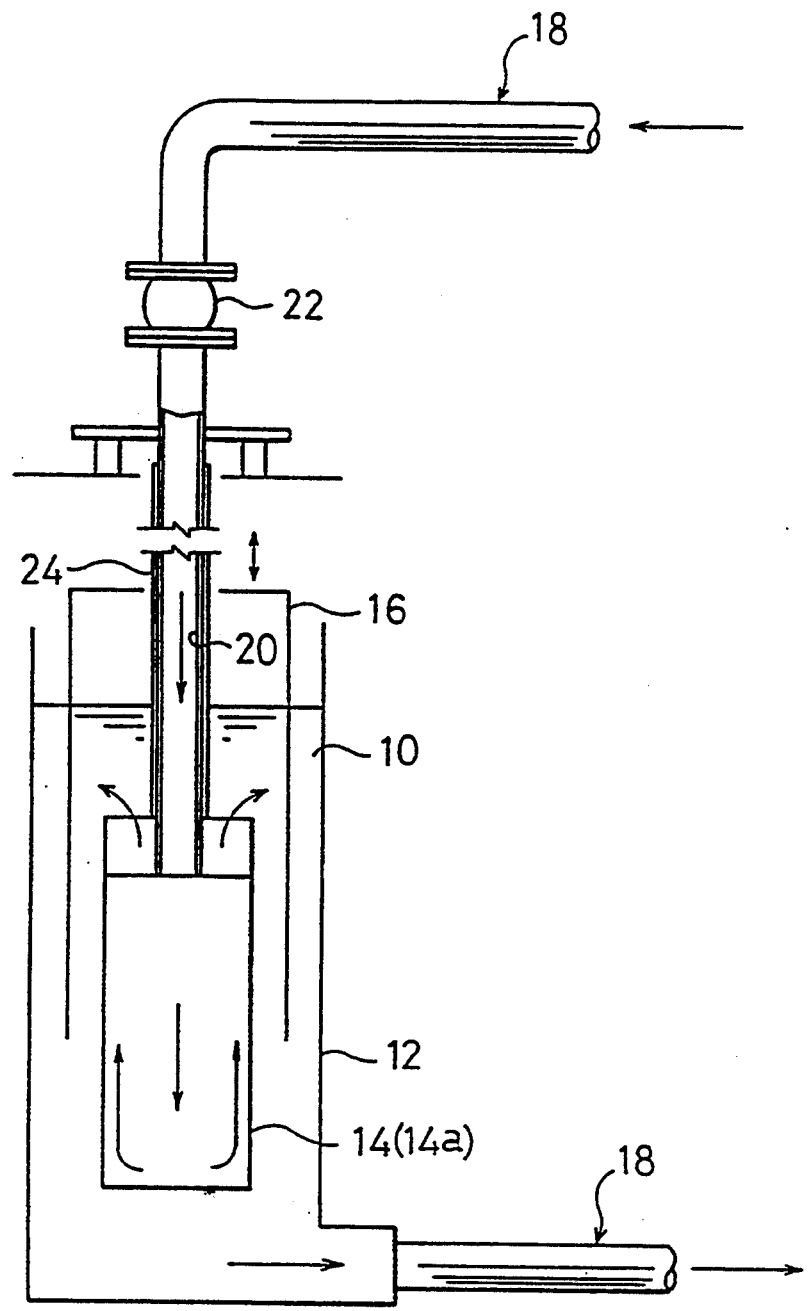
FIGS. 5 and 6 are schematics showing the construction of the main electrode.
Figure 6:
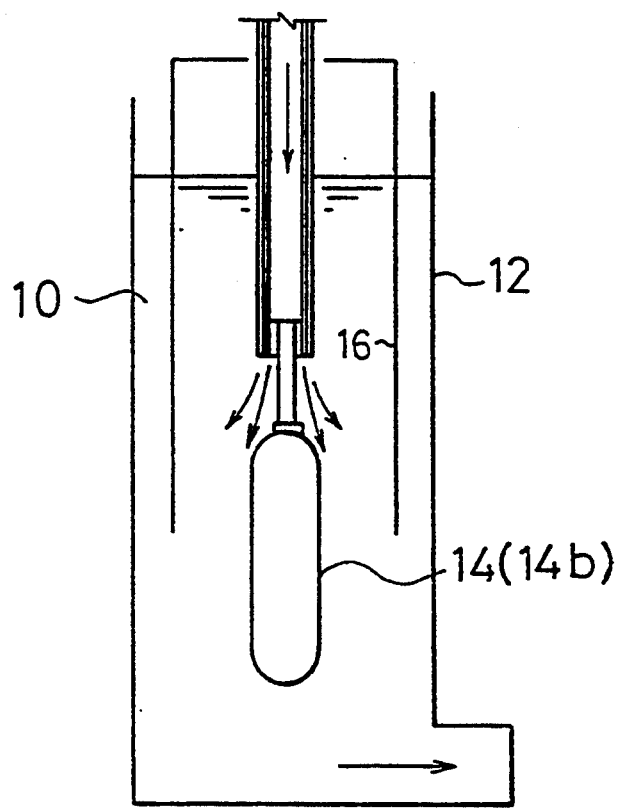

FIGS. 5 and 6 represents the construction of the main electrode 14.

A substantially cylindrical main electrode 14a shown in FIG. 5 is designed to be used for testing a low-voltage type of power generator working at 200 to 400 V.

An elongated, cylindrical main electrode 14b of an oval shape in lengthwise section, shown in FIG. 6, is designed to be used for testing a high-voltage type of power generator working at 3,300 to 6,600 V.

These main electrodes 14a and 14b are detachably connected to each feed pipe 20 through a flange or the like, and so can be easily selected depending on the standard voltage of the power generator to be tested.

Then, reference will be made to the construction of the fixed loading elements 42-1, 42-2 and 42-3.

Figure 7:
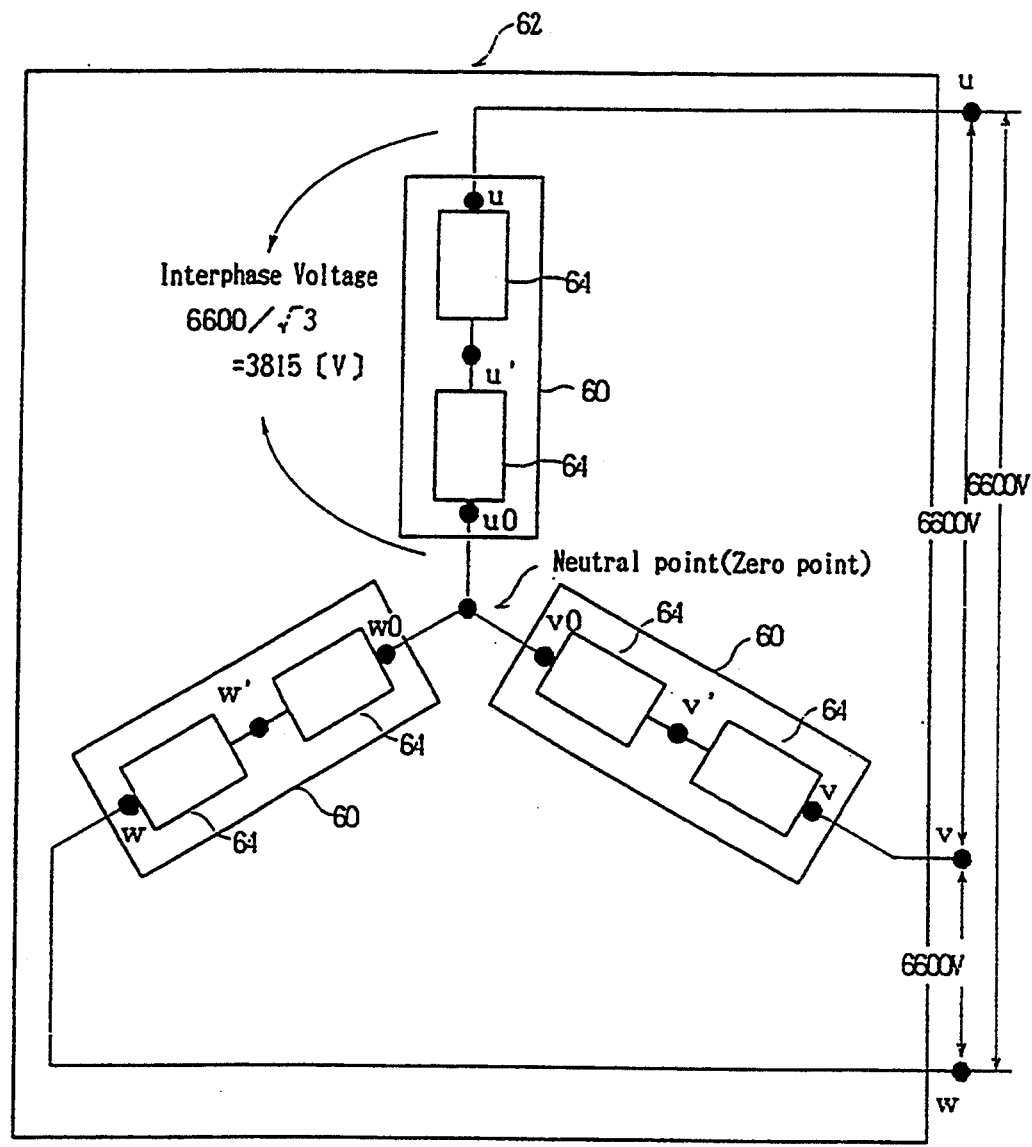
FIGS. 7 and 8 are schematics showing the construction of the fixed loading element.
Figure 8:
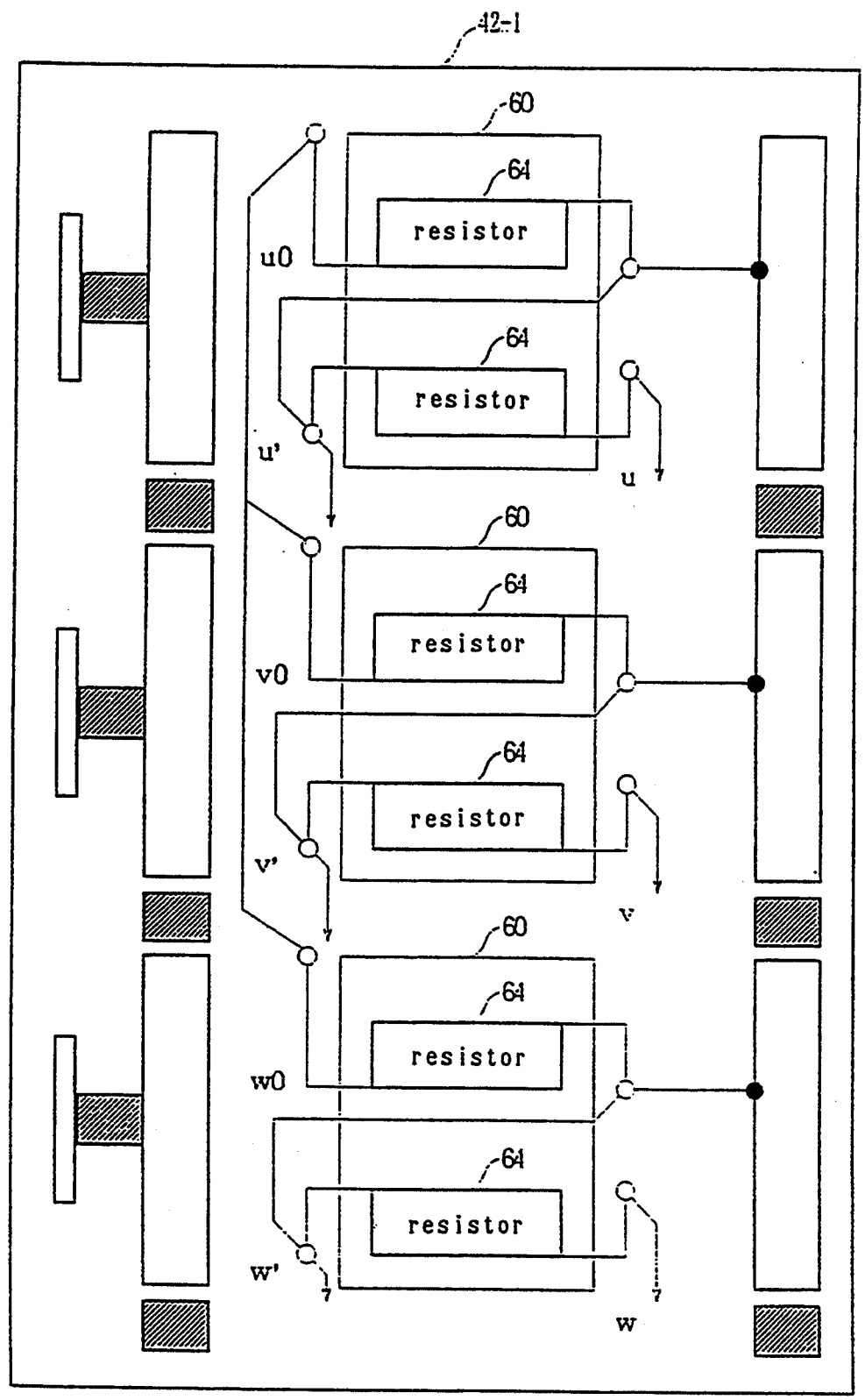

As can be seen from FIGS. 7 and 8, each of the fixed loading elements 42-1, 42-2 and 42-3 is built up of a loading element body 62 including circuits 60.

The respective circuits 60 are connected with each other through star connections. Referring to a fixed loading element of 6.6 KV as an example, the interphase voltage between the terminals u-u0 is set at 3,815 V.

Figure 9:
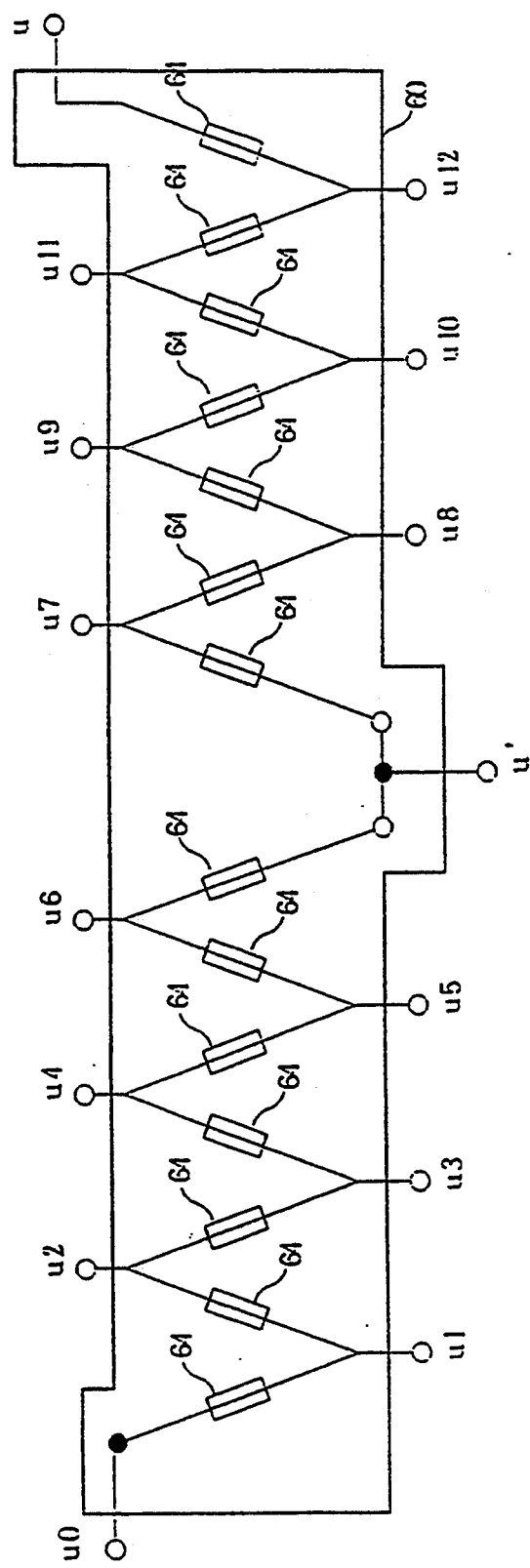
FIG. 9 is a schematic showing the construction of a plurality of resistors.

Referring here to the circuit 60, it is constructed by combining a plurality of resistors 64 with each other, as shown in FIG. 9.

Figure 10:
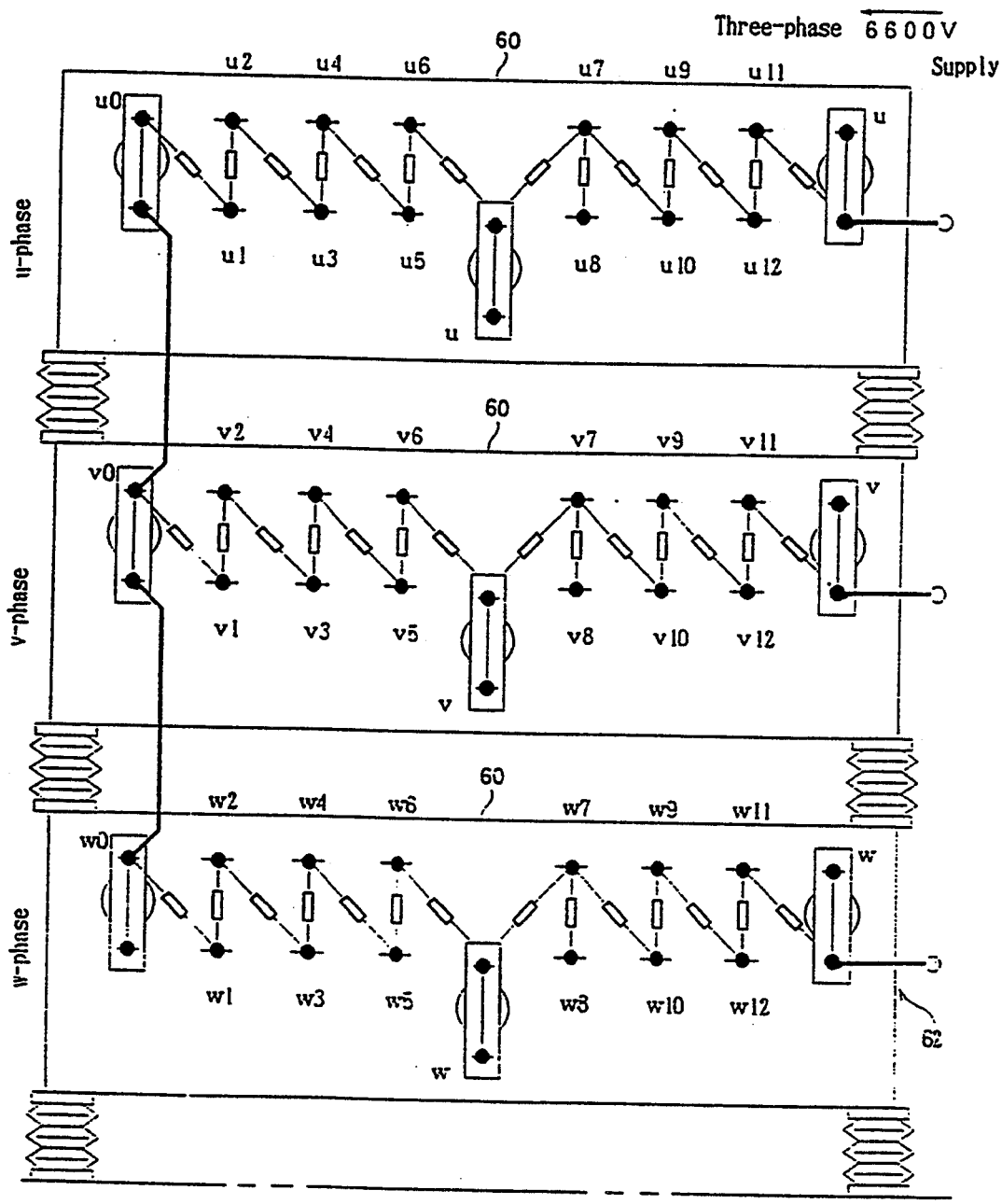
FIG. 10 is a schematic showing the fixed loading element preset at variable 6.6 KV.

In the arrangement, when the fixed loading element 42-1, 42-2 or 42-3 is used at a voltage of 6.6 KV, a plurality of resistors 64 in the circuit 60 are connectively combined with each other as illustrated in FIGS. 8 and 10, and connecting cables extending from the power source are connected to terminals u, v and w, respectively.

Figure 11:
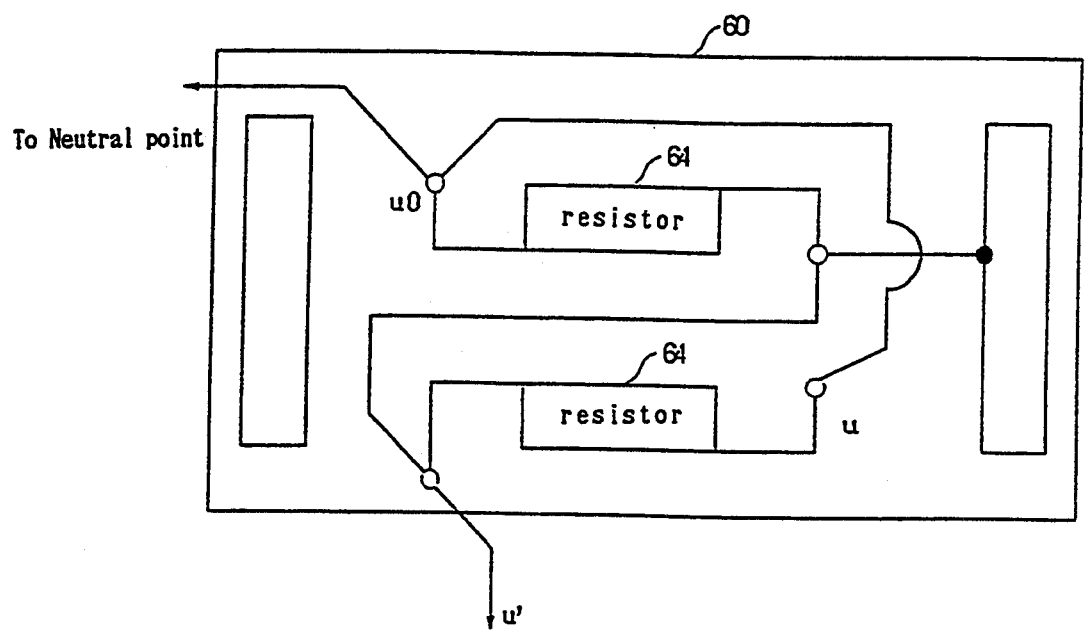
FIGS. 11 and 12 are schematics showing the fixed loading element preset at variable 3.3 KV.
Figure 12:
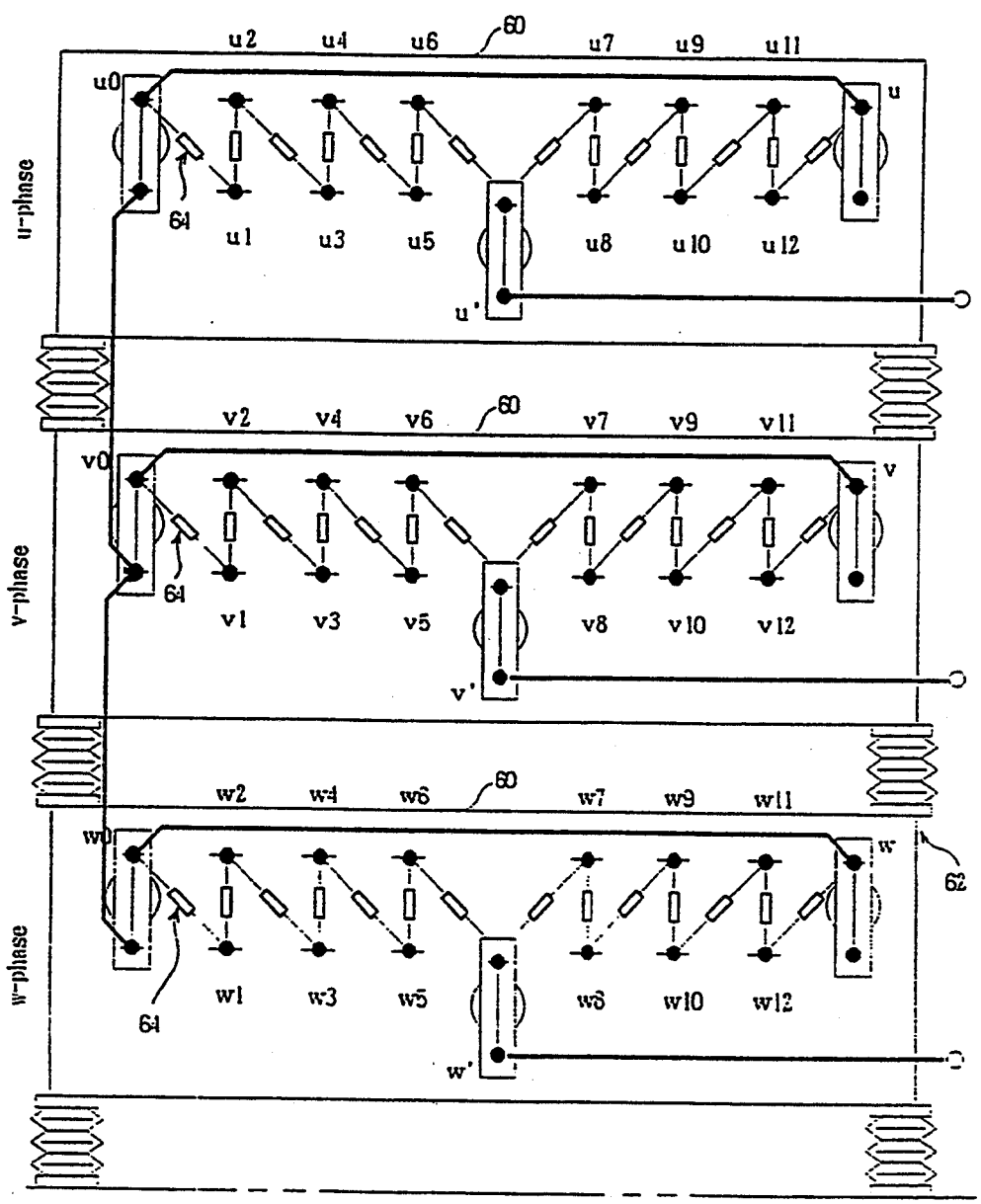
Figure 13:
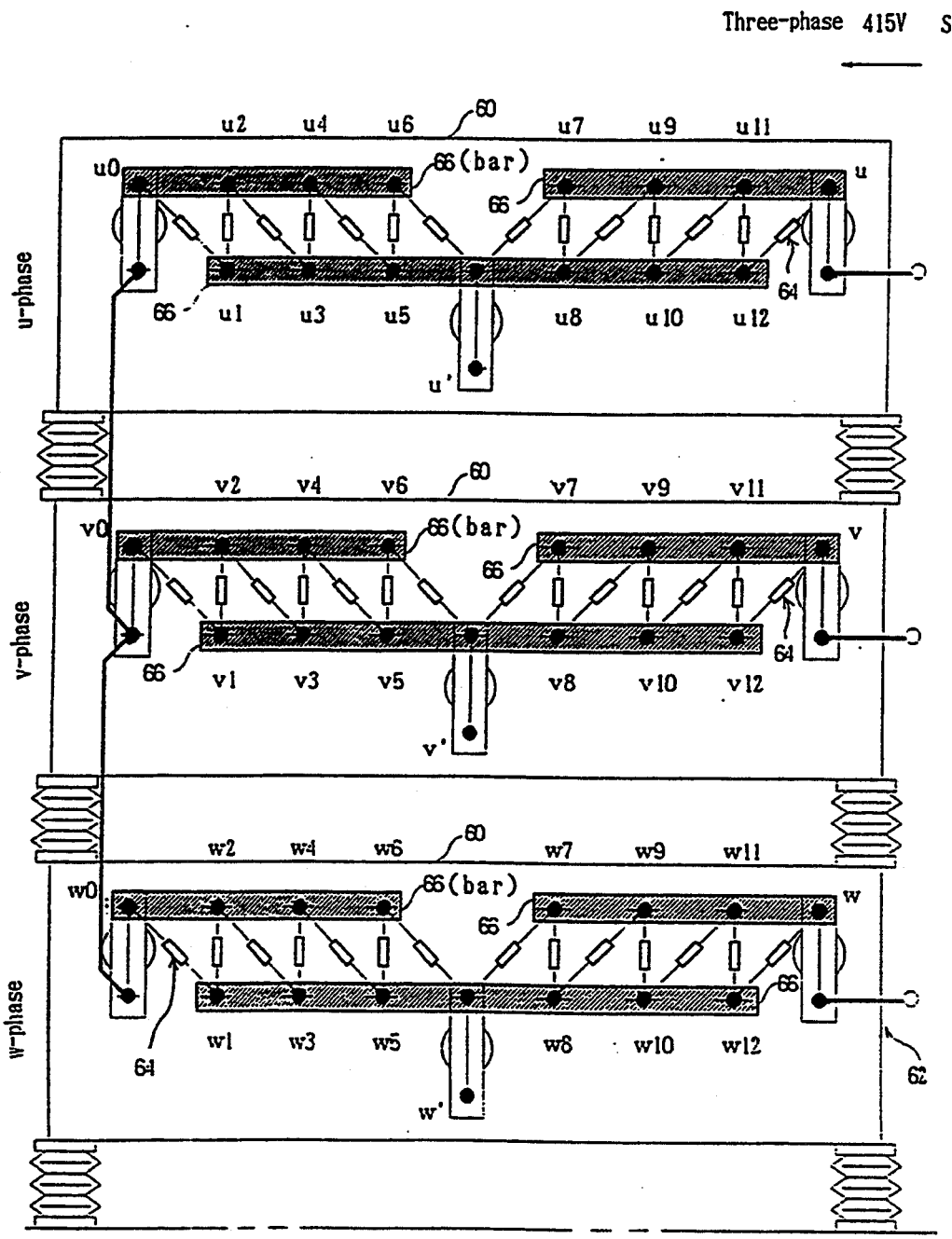
FIG. 13 is a schematic showing the fixed loading element preset at variable 415 V.

Alternatively, when the fixed loading element 42-1, 42-2 or 42-3 is used at 3.3 KV, a plurality of resistors 64 in the circuit 60 may be connectively combined with each other, while the terminal u0 and a terminal u' may be connected to the neutral point (the so-called zero point) of the star connection and the connecting terminal from the power source, respectively, as shown in FIGS. 11 and 12.

Figure 14:
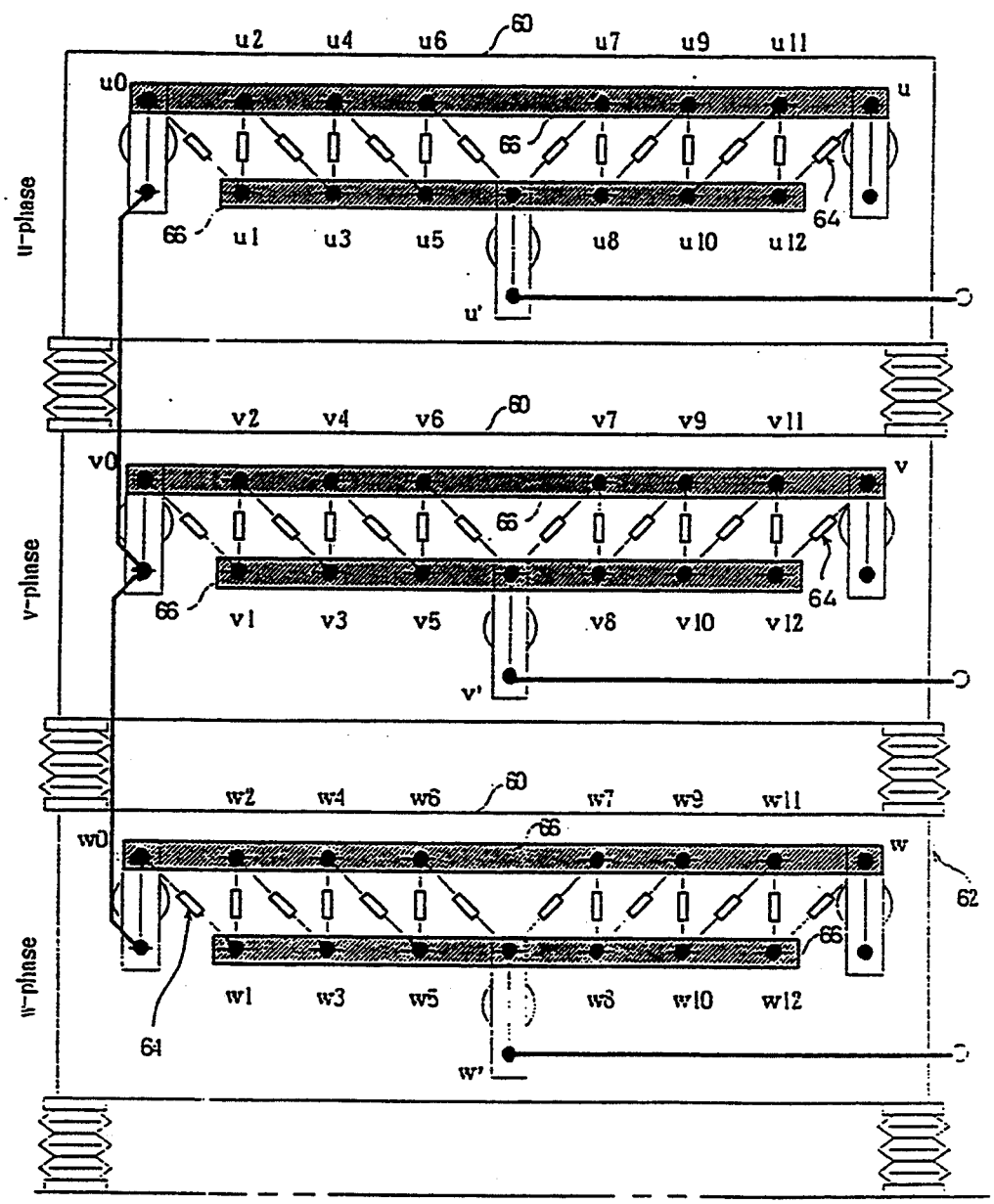
FIG. 14 is a schematic showing the fixed loading element preset at variable 200 V.
Figure 15:
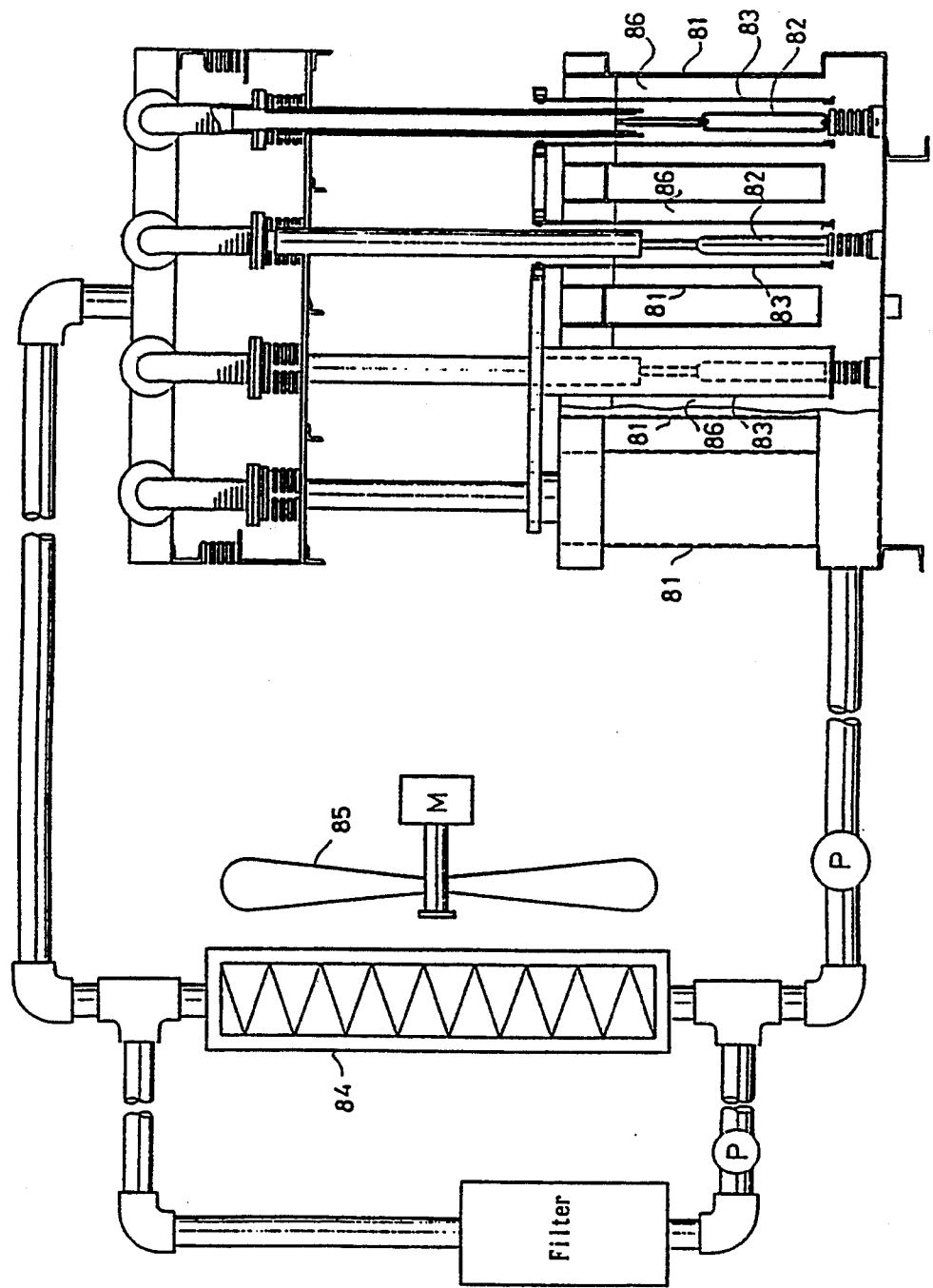
FIGS. 15 and 16 are schematics showing a conventional loading element.
Figure 16:
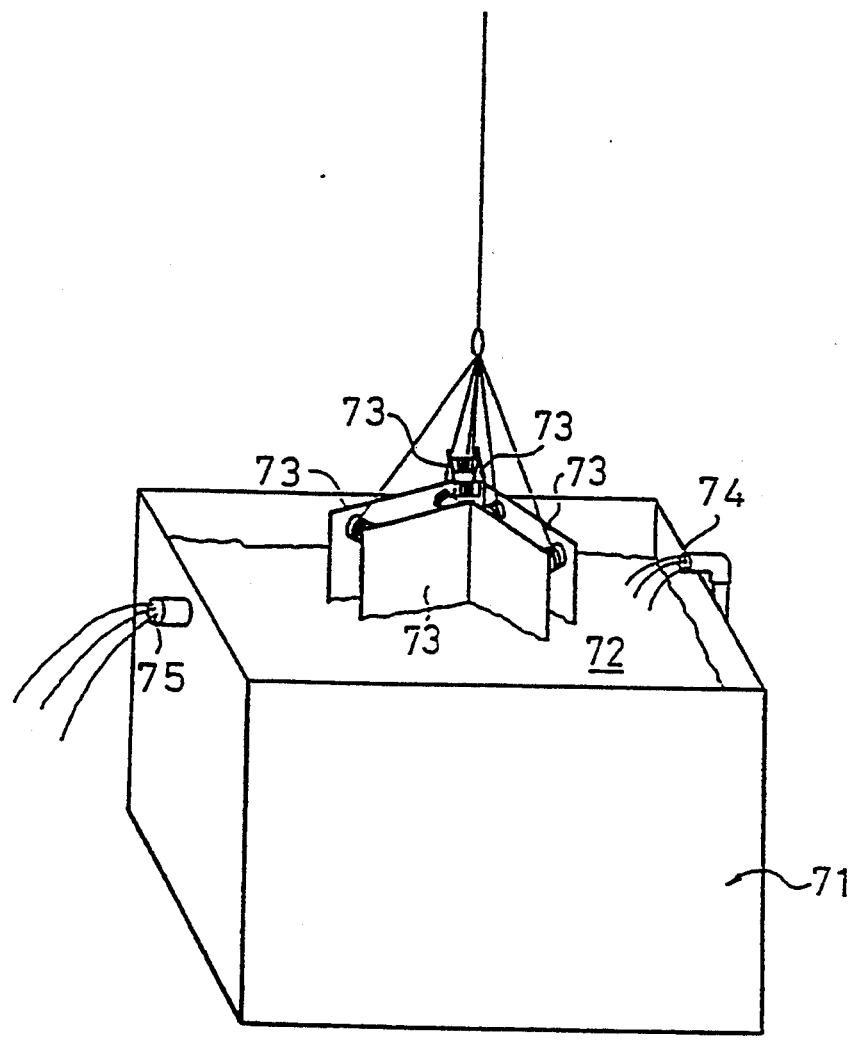

Further, when it is intended to use the fixed loading element 42 at 200 V, a plurality of resistors 64 may be mutually short-circuited with bars 66 or other cables, etc., as shown in FIG. 14, and the terminals u′, v′ and w′ may then be connected to the connecting terminals from the power sources.

Thus, the combined connection of a plurality of resistors 64 in the circuit 60 can be easily varied depending upon what type of operation is to be done; that is, the voltage of the fixed loading element 42 can be varied rapidly and surely.

This enables the voltage values of the fixed loading elements 42-1, 42-2 and 42-3 to be easily varied without recourse to heavy transformers located adjacent thereto.

Reference will now be made to how testing is done with this embodiment. For instance, a high-voltage (6.6 KV) large-capacity (2,000 KW) type of power generator is tested with the testing equipment which is built up of one water loading device 36 of the small capacity type (of a capacity of 500 KW and with the main electrode 4a designed for low voltage application) and three fixed loading elements 42-1, 42-2 and 42-3 (each with a capacity of 500 KW and a voltage of 6.6 KV), all connected in parallel with each other.

In this case, it is unnecessary to change over the combined connection of the resistors 64 in the circuit 60, because the above fixed loading elements 42-1, 42-2 and 42-3 are each preset at 6.6 KV.

The generator testing is done by a so-called load test and a so-called governor test. For the load test, a load of 500 KW is first applied at a voltage of 6.6 KV to the power generator for 10 minutes. Next is applied a further 500 KW or a total of 1,000 KW for about 10 minutes. Next is applied a further 500 KW or a total of 1,500 KW for about 10 minutes. Finally applied is a further 500 KW or a total of 2,000 KW for about 3–4 hours.

As can be understood from FIG. 2, the initial 500 KW load test is carried out by connecting the connecting terminal 40-1 for the fixed loading element 42-1 placed at the second stage to the power generator 30, and the next 1,000 KW load test ms done by connecting the connecting terminals 4-1 and 40-2 for the second and third fixed loading elements 42-1 and 42-2 to the generator 30.

The next 1,500 KW load test is carried out by connecting the connecting terminal 40-3 for the fixed loading element 42-3 located at the fourth stage to the generator 30.

Especially when the generator 30 is operated by a diesel engine, however, it is impossible to apply a 500 KW load to the generator 30 at one time for the final 2,000 KW load test in consideration of protecting the diesel engine; in other words, that load must be incrementally applied to the generator 30.

Accordingly, the small capacity type of water loading device 36, located at the first stage, is connected to the generator 30 through the connecting terminal 33 to increase the load thereon incrementally by operating the movable insulator 16 mounted thereon or, more specifically, allowing the movable insulator 16 to go up, thereby increasing the area between the main electrode 14 and the tank 12 through which the current passes, whereby the final load of 2,000 KW is applied on the generator 30 over a period of 3–4 hours.

How to carry out the governor test will now be explained.

The goal of this test is to determine whether there is a fault in a prime mover or power generator by loading and unloading.

For instance, a high-voltage (6.6 KV) large-capacity (1,000 KW rather than 2,000 KW) type of power generator 30 is tested with test equipment built up of one water loading device 36 of the small capacity type (having a capacity of 500 KW) and one fixed loading device 42 (having a capacity of 500 KW and a voltage of 6.6 KV) connected in parallel with each other.

In this case, the governor test is carried out by the loading and unloading of 250 KW, then 500 KW, then 750 KW and finally 1,000 KW.

The first 250 KW loading and unloading are carried out while the small capacity type of water loading device 36, located at the first stage, is connected to the generator 30 through the associated terminal 33 and the capacity value is set at 250 KW by operating the movable insulator 16 provided on the water loading device 36.

Likewise, the second 500 KW loading and unloading are done while the load of 500 KW is applied on the small capacity type of water loading device 36 by operating the movable insulator 16 provided thereon.

Then, the 750 KW loading and unloading are done by the fixed loading device 42-1 (with a capacity of 500 KW and a voltage of 6.6 KV) and the water loading device 36 with the maximum capacity of 500 KW regulated by the movable insulator 16, both being connected in parallel with each other.

Finally, the 1,000 KW loading and unloading are carried out by the water loading device 36 regulated to a maximum capacity of 500 KW with the fixed loading element 62-1 (with a capacity of 500 KW and a voltage of 6.6 KV) and the movable insulator 16.

Next, how to test a high-voltage (3.3 KV) large-capacity (2,000 KW) type of power generator will be explained.

Again, the test equipment is built up of one small capacity type of water loading device 36 (with a capacity of 500 KV) and three fixed loading elements 42 (with a capacity of 500 KW and a voltage of 6.6 KV), all connected in parallel with each other.

In this case, it is necessary to change over the combined connection of the resistors 64 in the circuit 60, because the above fixed loading elements 42-1, 42-2 and 42-3 are each preset at 6.6 KV.

That is, the connection of the resistors 64 in the circuit 60 is changed over, as shown in FIGS. 11 and 12; the voltage of each fixed loading element 42-1, 42-2 or 42-3 is reset at 3.3 KV.

This may be achieved by changing the 6.6 KV state shown in FIG. 6 to the 3.3 KV state shown in FIG. 12.

In this state, load testing is done.

A load of 500 KW is first applied at a voltage of 3.3 KV to the power generator for 10 minutes. Next is applied a further 500 KW or a total of 1,000 KW for about 10 minutes. Next is applied a further 500 KW or a total of 1,500 KW for about 10 minutes. Finally applied is a further 500 KW or a total of 2,000 KW for about 3–4 hours.

As can be understood from FIG. 2, the initial 500 KW load test is carried out by connecting the connecting terminal 40-1 for the fixed loading element 42-1 placed at the second stage and preset at 3.3 KV to the power generator 30, and the next 1,000 KW load test is done by connecting the connecting terminals 40-1 and 40-2 for the second and third fixed loading elements 42-1 and 42-2 that are preset at 3.3 KV to the generator 30.

The next 1,500 KW load test is carried out by connecting the connecting terminal 40-3 for the fixed loading element 423 located at the fourth stage and preset at 3.3 KV to the generator 30.

It is noted, however, that it is impossible to apply a 500 KW load to the generator 30 at one time for the final 2,000 KW load test; in other words, that load must be incrementally applied to the generator 30.

Accordingly, the small capacity type of water loading device 36, located at the first stage, is connected to the generator 30 through the connecting terminal 33 to increase the load thereon incrementally by operating the movable insulator 16 mounted thereon, whereby the final load of 2,000 KW is applied on the generator 30 over a period of 3–4 hours.

In this case, it should be noted that the voltage of the water loading device 36 is increased from 415 V to 3.3 KV by changing the main electrode from 14a to 14b.

How to carry out the governor test will now be explained.

The power generator 30 under test is a high-voltage (3.3 KV) type having a capacity of 1,000 KW.

In this case, the testing equipment is built up of one small capacity type of water loading device 36 (with a capacity of 500 KW) and one fixed loading element 42 (with a capacity of 500 KW and a voltage of 3.3 KV), both connected in parallel with each other.

In this case, the governor test is carried out by the loading and unloading of 250 KW, then 500 KW, then 750 KW and finally 1,000 KW.

The first 250 KW loading and unloading are carried out while the small capacity type of water loading device 36, located at the first stage, is connected to the generator 30 through the associated terminal 33 and the capacity value is set at 250 KW by operating the movable insulator 16 provided on the water loading device 36.

Likewise, the second 500 KW loading and unloading are done while the load of 500 KW is applied on the small capacity type of water loading device 36 by operating the movable insulator 16 provided thereon.

Then, the 750 KW loading and unloading are done by the fixed loading device 42-1 (with a capacity of 500 KW and a voltage of 6.6 KV) and the water loading device 36 with the maximum capacity of 500 KW regulated by the movable insulator 16, both being connected in parallel with each other.

Finally, the 1,000 KW loading and unloading are carried out by the water loading device 36 regulated to a maximum capacity of 500 KW with the fixed loading element 62-1 (with a capacity of 500 KW and a voltage of 6.6 KV) and the movable insulator 16.

Further reference will be made to how to test the power generator that is a low-voltage (200 V) large-capacity (200 KW) type.

Again, the testing equipment is built up of one small-capacity (500 KW) type of water loading device 36 and three fixed loading elements 42-1, 42-2 and 42-3 (each with a capacity of 500 KW and a voltage regulated to 200 V by change-over operation), all connected in parallel with each other.

It is then required to change over the combined connection of the resistors 64 in the circuit 60 to regulate their voltage to 200 V, because each fixed loading element is preset at 6.6 KV.

That is to say, the connection of the resistors 64 are short-circuited by the bars 66, as shown in FIG. 14, whereby the respective voltages of the fixed loading elements 42-1, 42-2 and 42-3 can be reset at 200 V.

Load testing is done after the voltage of each fixed loading element is preset at 200 V.

More specifically, a load of 500 KW is first applied at a voltage of 200 v to the power generator for 10 minutes. Next is applied a further 500 KW or a total of 1,000 KW for about 10 minutes. Next is applied a further 500 KW or a total of 1,500 KW for about 10 minutes. Finally applied is a further 500 KW or a total load of 2,000 KW for about 3–4 hours.

As can be understood from FIG. 2, the initial 500 KW load test is carried out by connecting the connecting terminal 40-1 for the fixed loading element 42-1 placed at the second stage to the power generator 30, and the next 1,000 KW load test is done by connecting the connecting terminals 40-1 and 40-2 for the second and third fixed loading elements 42-1 and 42-2 to the generator 30.

The next 1,500 KW load test is carried out by connecting the connecting terminal 40-3 for the fixed loading element 423 located at the fourth stage to the generator 30.

It is noted, however, that it is impossible to apply a 500 KW load to the generator 30 at one time for the final 2,000 KW load test; in other words, that load must be incrementally applied to the generator 30.

Accordingly, the small capacity type of water loading device 36, located at the first stage, is connected to the generator 30 through the connecting terminal 33 to increase the load thereon incrementally by operating the movable insulator 16 mounted thereon, whereby the final load of 2,000 KW is applied on the generator 30 over a period of 3–4 hours.

How to test the governor test will be explained.

The generator 30 to be tested now works at 200 V (low voltage) and has a capacity of 1,000 KW.

The testing equipment used to this end is built up of one small-capacity (500 KW) type of water loading device 36 and one fixed loading element 42 with the voltage of the internal circuit 60 changed to 200 V—which works at 200 V and has a capacity of 500 KW), both connected in parallel with each other.

In this case, the governor test is carried out by the loading and unloading of 250 KW, then 500 KW, then 750 KW and finally 1,000 KW.

The first 250 KW loading and unloading are carried out while the small capacity type of water loading device 36, located at the first stage, is connected to the generator 30 through the associated terminal 33 and the capacity value is set at 250 KW by operating the movable insulator 16 provided on the water loading device 36. Likewise, the second 500 KW loading and unloading are done while the load of 500 KW is applied on the small capacity type of water loading device 36 by operating the movable insulator 16 provided thereon.

Then, the 750 KW loading and unloading are done by the fixed loading device 42-1 (with a capacity of 500 KW and a voltage of 200 V) and the water loading device 36 with the maximum capacity of 500 KW regulated by the movable insulator 16, both being connected in parallel with each other.

Finally, the 1,000 KW loading and unloading are carried out by the water loading device 36 regulated to a maximum capacity of 500 KW with the fixed loading element 42-1 (with a capacity of 500 KW and a voltage of 200 V) and the movable insulator 16.

Even for such tests as mentioned above, it is required to regulate the loads to be applied; that is, of great importance is the water loading device 36 with the movable insulator 16 built in it.

Note that of importance during testing is to cool the water loading device 36 and the fixed loading elements 42-1, 42-2 and 42-3 by the associated fans 41-2, 41-3 and 41-4 located adjacent them, because of their temperature increase.

Also note that each testing unit is pre-mounted on the bed of a vehicle because it is often carried to where power generator testing is needed.

Thus, the tests of every power generator including those of high-voltage (6.6 or 3.3 KV) large-capacity (1,000 or 200 KW), high-voltage (6.6 or 3.3 KV) small capacity (500 KW), low-voltage (415 or 200 V) large capacity (1,000 or 2,000 KW) and low-voltage (415 or 200 V) small-capacity (500 KW) types can be safely, rapidly and precisely done with a single test equipment by selectively changing one of the loading elements to another, which are incorporated therein. In addition, not only is the total weight of the test equipment reduced, but also the amount of water used is reduced, thereby ensuring smooth load testing.

What is claimed is:

1. A change-over type of testing equipment for non-utility power generators, etc., which includes; a current-passing tank through which is charged with a resistance liquid, a main electrode disposed in the tank so as to receive power from the non-utility power generator to be tested, a movable insulator located between the main electrode and the tank to regulate the quantity of the current passing from the main electrode to the tank, a pipe system to cool or filter the resistance liquid within the tank for feeding the liquid back to the tank, thereby recycling the liquid, and a feed pipe connected to the pipe system on the upstream side of the tank to feed the liquid into the tank, said feed pipe serving as a holding member for holding the main electrode inserted into the tank from above and as a power supply member for supplying power from the non-utility power generator to be tested to the main electrode, said main electrode including a small capacity type of water loading device selectively preset at a low or high voltage depending on the standard voltage of the non-utility power generator to be tested, a connecting terminal provided on the water loading device, and a plurality of fixed loading elements having connecting terminals, which are connected in parallel with each other together with the water loading device, said fixed loading elements including a circuit set up by combining and connecting a plurality of resistors with each other and having a loading element body to which the output voltage of the power generator is applied, and a change-over unit for selecting the resistors in the circuit so that the withstand voltage of the circuit corresponds to the output voltage of the power generator 1, whereby said testing equipment can be accommodated to testing a low or high voltage type of power generator by selectively presetting the main electrode at a low or high voltage and changing over the connection of the resistors in the circuit by the change-over unit, or to testing a small or large capacity type of power generator by changing over the connection of the water loading device 36 and the fixed loading elements.

* * * * *